(12) United States Patent
Klomp et al.

(10) Patent No.: US 7,394,520 B2
(45) Date of Patent: Jul. 1, 2008

(54) TEMPERATURE CONDITIONED LOAD LOCK, LITHOGRAPHIC APPARATUS COMPRISING SUCH A LOAD LOCK AND METHOD OF MANUFACTURING A SUBSTRATE WITH SUCH A LOAD LOCK

(75) Inventors: Albert Jan Hendrik Klomp, Eindhoven (NL); Jan Frederik Hoogkamp, Breda (NL); Raimond Visser, Best (NL); Josephus Cornelius Johannes Antonius Vugts, Waalwijk (NL); Henricus Johannes Louis Marie Vullings, North Ryde (AU); Leo Wilhelmus Maria Kuipers, Eindhoven (NL); Johannes Hendrikus Gertrudis Franssen, Eersel (NL)

(73) Assignee: ASML Netherlands B.V., Veldhoven (NL)

(*) Notice: Subject to any disclaimer, the term of this patent is extended or adjusted under 35 U.S.C. 154(b) by 759 days.

(21) Appl. No.: 10/797,608

(22) Filed: Mar. 11, 2004

(65) Prior Publication Data
US 2005/0054217 A1 Mar. 10, 2005

(30) Foreign Application Priority Data
Mar. 11, 2003 (EP) ................... 03075703
Jul. 23, 2003 (EP) ................... 03077319

(51) Int. Cl.
*G03B 27/52* (2006.01)
*G03B 27/42* (2006.01)
(52) U.S. Cl. ............... 355/30; 355/53; 414/935; 414/939
(58) Field of Classification Search .......... 355/53, 355/72, 77; 414/935, 937, 939, 940, 941; 430/311, 322
See application file for complete search history.

(56) References Cited

U.S. PATENT DOCUMENTS

| 5,229,872 A | 7/1993 | Mumola |
| 5,296,891 A | 3/1994 | Vogt et al. |
| 5,523,193 A | 6/1996 | Nelson |
| 5,563,683 A | 10/1996 | Kamiya |
| 5,730,573 A | 3/1998 | Masujima et al. |

(Continued)

FOREIGN PATENT DOCUMENTS

EP 1 282 157 A2 2/2003

(Continued)

OTHER PUBLICATIONS

English Translation of JP 09-246347 (dated Sep. 19, 1997) cited by Applicant in an IDS.*

(Continued)

*Primary Examiner*—Alan A Mathews
(74) *Attorney, Agent, or Firm*—Pillsbury Winthrop Shaw Pittman LLP

(57) ABSTRACT

A load lock for a lithographic apparatus is arranged to transfer an object, like a substrate, into and from the lithographic apparatus. The load lock outer wall defining at least part of a load lock volume accommodating a support unit for supporting the object when in the load lock. The load lock also has a temperature conditioned structure to control the temperature of the object to a desired temperature at least before the object is transferred from the load lock towards the lithographic projection apparatus.

25 Claims, 7 Drawing Sheets

U.S. PATENT DOCUMENTS

| | | |
|---|---|---|
| 5,914,493 A | 6/1999 | Morita et al. |
| 5,969,441 A | 10/1999 | Loopstra et al. |
| 6,046,792 A | 4/2000 | Van Der Werf et al. |
| 6,281,510 B1 | 8/2001 | Yoshitake et al. |
| 6,308,776 B1 | 10/2001 | Sloan et al. |
| 6,370,793 B1 | 4/2002 | Chae et al. |
| 6,906,783 B2 | 6/2005 | Del Puerto et al. |
| 2001/0016302 A1 | 8/2001 | Hirayanagi et al. |
| 2003/0021671 A1* | 1/2003 | Edo ........................... 414/939 |
| 2003/0082030 A1 | 5/2003 | Del Puerto et al. |
| 2004/0218168 A1 | 11/2004 | Van Groos et al. |
| 2004/0263823 A1 | 12/2004 | Klomp et al. |

FOREIGN PATENT DOCUMENTS

| | | |
|---|---|---|
| EP | 1 341 042 A2 | 9/2003 |
| EP | 1 282 157 A3 | 3/2004 |
| EP | 1 341 042 A3 | 3/2004 |
| JP | 03180023 | 8/1991 |
| JP | 4-48716 | 2/1992 |
| JP | 07-204984 | 8/1995 |
| JP | 9-246347 A | 9/1997 |
| JP | 10-92738 | 4/1998 |
| JP | 11-135416 | 5/1999 |
| JP | 2001-222099 A | 8/2001 |
| JP | 2002-075856 | 3/2002 |
| JP | 2003-031639 | 1/2003 |
| JP | 2003-045947 | 2/2003 |
| WO | WO 98/33096 | 7/1998 |
| WO | WO 98/38597 | 9/1998 |
| WO | WO 98/40791 | 9/1998 |

OTHER PUBLICATIONS

English Translation of JP 2001-222099 (dated Aug. 17, 2001) cited by Applicant in an IDS.*
English Translation of JP 10-092738 (dated Apr. 10, 1998) cited by Applicant in an IDS.*
English Translation of JP 11-135416 (dated May 21, 1999) cited by Applicant in an IDS.*
Korean Office Action in Korean Application No. 10-2004-0016527 dated Oct. 31, 2005.
Japanese Office Action issued for Japanese Patent Application No. 2004-067361 dated May 2, 2007.

* cited by examiner

TEMPERATURE CONDITIONED LOAD LOCK, LITHOGRAPHIC APPARATUS COMPRISING SUCH A LOAD LOCK AND METHOD OF MANUFACTURING A SUBSTRATE WITH SUCH A LOAD LOCK

The present invention claims priority from European Patent Application No. 03075703.3 filed Mar. 11, 2003 and European Patent Application No. 03077319.6 filed Jul. 23, 2003, the entire contents of both are incorporated herein in their entireties by reference.

FIELD OF THE INVENTION

The invention relates to temperature control in a load lock for a lithographic apparatus.

SUMMARY

A "load lock" is an apparatus to facilitate transfer of an object, such as a substrate, from a first environment to a second environment, where one of the environments may have a lower pressure than the other environment. During the transfer of an object from the first environment to the second environment the interior of the load lock is brought down to a lower pressure or raised to a higher pressure. Other possibilities are that the two environments have different temperatures or different atmospheres, e.g. different gas compositions.

A lithographic apparatus is a machine that applies a desired pattern onto a target portion of a substrate. Lithographic apparatus can be used, for example, in the manufacture of integrated circuits (ICs). In that circumstance, a patterning device or patterning structure, such as a mask, may be used to generate a circuit pattern corresponding to an individual layer of the IC, and this pattern can be imaged onto a target portion (e.g. comprising part of, one or several dies) on a substrate (e.g. a silicon wafer) that has a layer of radiation-sensitive material (resist). In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction. The light source can be UV, DUV, EUV-light or an electron beam.

RELATED ART

The term "patterning device" as here employed should be broadly interpreted as referring to devices that can be used to endow an incoming radiation beam with a patterned cross-section, corresponding to a pattern that is to be created in a target portion of the substrate; the term "light valve" can also be used in this context. Generally, the pattern will correspond to a particular functional layer in a device being created in the target portion, such as an integrated circuit or other device (see below). Examples of such patterning devices include:

a mask. The concept of a mask is well known in lithography, and it includes mask types such as binary, alternating phase-shift, and attenuated phase-shift, as well as various hybrid mask types. Placement of such a mask in the radiation beam causes selective transmission (in the case of a transmissive mask) or reflection (in the case of a reflective mask) of the radiation impinging on the mask, according to the pattern on the mask. In the case of a mask, the support structure will generally be a mask table, which ensures that the mask can be held at a desired position in the incoming radiation beam, and that it can be moved relative to the beam if so desired;

a programmable mirror array. One example of such a device is a matrix-addressable surface having a viscoelastic control layer and a reflective surface. The basic principle behind such an apparatus is that (for example) addressed areas of the reflective surface reflect incident light as diffracted light, whereas unaddressed areas reflect incident light as undiffracted light. Using an appropriate filter, the undiffracted light can be filtered out of the reflected beam, leaving only the diffracted light behind; in this manner, the beam becomes patterned according to the addressing pattern of the matrix-addressable surface. An alternative embodiment of a programmable mirror array employs a matrix arrangement of tiny mirrors, each of which can be individually tilted about an axis by applying a suitable localised electric field, or by employing piezoelectric actuation devices. Once again, the mirrors are matrix-addressable, such that addressed mirrors will reflect an incoming radiation beam in a different direction to unaddressed mirrors; in this manner, the reflected beam is patterned according to the addressing pattern of the matrix-addressable mirrors. The matrix addressing can be performed using suitable electronic devices. In both of the situations described above, the patterning device can comprise one or more programmable mirror arrays. More information on mirror arrays as here referred to can be gleaned, for example, from U.S. Pat. Nos. 5,296,891 and 5,523,193, and PCT patent applications WO 98/38597 and WO 98/33096. In the case of a programmable mirror array, the support structure may be embodied as a frame or table, for example, which may be fixed or movable as needed; and a programmable LCD array. An example of such a construction is given in U.S. Pat. No. 5,229,872. As above, the support structure in this case may be embodied as a frame or table, for example, which may be fixed or movable as needed.

For purposes of simplicity, the rest of this text may, at certain locations, specifically direct itself to examples involving a mask and mask table; however, the general principles discussed in such instances should be seen in the broader context of the patterning device as above set forth.

Lithographic projection apparatus can be used, for example, in the manufacture of integrated circuits (ICs). In such a case, the patterning device may generate a circuit pattern corresponding to an individual layer of the IC, and this pattern can be imaged onto a target portion (e.g. comprising one or more dies) on a substrate (silicon wafer) that has been coated with a layer of radiation-sensitive material (resist). In general, a single wafer will contain a whole network of adjacent target portions that are successively irradiated via the projection system, one at a time. In current apparatus, employing patterning by a mask on a mask table, a distinction can be made between two different types of machine. In one type of lithographic projection apparatus, each target portion is irradiated by exposing the entire mask pattern onto the target portion in one go; such an apparatus is commonly referred to as a wafer stepper or step-and-repeat apparatus. In an alternative apparatus—commonly referred to as a step-and-scan apparatus—each target portion is irradiated by progressively scanning the mask pattern under the projection beam in a given reference direction (the "scanning" direction) while synchronously scanning the substrate table parallel or anti-parallel to this direction; since, in general, the projection system will have a magnification factor M (generally <1), the speed V at which the substrate table is scanned will be a factor M times that at which the mask table is scanned. More information with regard to lithographic devices as here described can be gleaned, for example, from U.S. Pat. No. 6,046,792.

In a manufacturing process using a lithographic projection apparatus, a pattern (e.g. in a mask) is imaged onto a substrate that is at least partially covered by a layer of radiation-sensitive material (resist). Prior to this imaging step, the substrate may undergo various procedures, such as priming, resist coating and a soft bake. After exposure, the substrate may be subjected to other procedures, such as a post-exposure bake (PEB), development, a hard bake and measurement/inspection of the imaged features. This array of procedures is used as a basis to pattern an individual layer of a device, e.g. an IC. Such a patterned layer may then undergo various processes such as etching, ion-implantation (doping), metallization, oxidation, chemo-mechanical polishing, etc., all intended to finish off an individual layer. If several layers are necessary, then the whole procedure or a variant thereof, will have to be repeated for each new layer. Eventually, an array of devices will be present on the substrate (wafer). These devices are then separated from one another by a technique such as dicing or sawing, whence the individual devices can be mounted on a carrier, connected to pins, etc. Further information regarding such processes can be obtained, for example, from the book "Microchip Fabrication: A Practical Guide to Semiconductor Processing", Third Edition, by Peter van Zant, McGraw Hill Publishing Co., 1997, ISBN 0-07-067250-4.

For the sake of simplicity, the projection system may hereinafter be referred to as the "lens"; however, this term should be broadly interpreted as encompassing various types of projection system, including refractive optics, reflective optics, and catadioptric systems, for example. The radiation system may also include components operating according to any of these design types for directing, shaping or controlling the projection beam of radiation, and such components may also be referred to below, collectively or singularly, as a "lens". Further, the lithographic apparatus may be of a type having two or more substrate tables (and/or two or more mask tables). In such "multiple stage" devices the additional tables may be used in parallel, or preparatory steps may be carried out on one or more tables while one or more other tables are being used for exposures. Dual stage lithographic apparatus are described, for example, in U.S. Pat. No. 5,969,441 and WO 98/40791.

SUMMARY OF THE INVENTION

In a typical lithography arrangement, substrates are transported to the substrate table of a lithographic projection apparatus via a substrate track and a substrate handler. In the substrate track the surface of the substrate is pre-treated. The pre-treatment of the substrate typically includes at least partially covering the substrate by a layer of radiation-sensitive material (resist). Further, prior to the imaging step, the substrate may undergo various other pre-treatment procedures, such as priming, and soft bake. After the pre-treatment of the substrate the substrate is transported from the substrate track to the substrate stage via the substrate handler.

The substrate handler typically is adapted to accurately position the substrate on the substrate table and may also control the temperature of the substrate.

For a certain lithographic projection apparatus, such as an apparatus using Extreme Ultra-Violet radiation (in short EUV-radiation), the projection onto a substrate can only be performed successfully under vacuum conditions. Therefore the substrate handler should be adapted to transfer the pre-treated substrate into a vacuum. That typically means that at least after the pre-treatment of the substrate in the substrate track, the handling and the temperature control of the substrate has to be accomplished in a vacuum.

For another type of lithographic projection apparatus, such as an apparatus operated in a $N_2$ environment using 157 nm radiation for example, it is necessary that a specific gas environment, such as a $N_2$-environment, is maintained. Therefore the substrate handler should be adapted to transfer the pre-treated substrate into a specific gas environment. That typically means that at least after the pre-treatment of the substrate in the substrate track, the handling and the temperature control of the substrate has to be accomplished in a specific gas environment.

Typically, a load lock may be provided between the substrate track and the handling chamber.

When lowering the pressure of the interior of a load lock, the pressure difference will influence the temperature inside the load lock chamber. By this also the temperature of the object, such as a substrate, in the load lock chamber can be influenced. Due to adiabatic processes, the temperature of the object can decrease when the pressure inside the load lock is decreased. With respect to an object to be processed in a lithographic projection assembly, the temperature of the object is one of the properties which should be controlled. This especially applies when the object is in the lithographic projection apparatus itself, however, this also means that in the transfer process towards and from the lithographic projection apparatus attention to the temperature of the substrate should be given.

The present invention deals with temperature control within such a load lock. To that end, the invention provides a load lock for a lithographic projection apparatus to facilitate transfer of an object into and from the lithographic projection apparatus, comprising an outer wall at least partly defining a load lock volume accommodating a support unit for supporting the object when in the load lock, the load lock comprising a temperature conditioned structure to control a temperature of the object to a desired temperature at least before the object is transferred from the load lock towards the lithographic projection apparatus.

The temperature conditioning structure within the load lock controls the temperature of the object by any thermal transfer known in the art, including radiation, convection and conduction.

The temperature condition structure may comprise at least one of the outer wall and the support unit.

To provide the temperature condition structure with a controlled temperature, it may comprise lines allowing a temperature controlled fluid to flow through them.

In an embodiment, the support unit may be provided with a supply line and a drain line, the supply line combined to provide a gas between the support unit and the object to provide a thermal bridge between the support unit and the object. The local pressure of that gas may be 200 to $10^4$ Pa.

In another embodiment, the support unit may be designed to substantially protect the object from a gas flow against a surface of the object when the load lock volume is depressurized.

In another embodiment, the load lock may be provided with a pump to depressurize the load lock volume. The pump may be connected to a processor arranged to evacuate the load lock volume by the pump to a predetermined first pressure, to wait during a predetermined time period and then to depressurize the load lock volume to a predetermined second pressure. During the time period that no, or substantially no pumping takes place, there is still enough gas within the load lock to provide a good thermal exchange between the temperature conditioned structure and the object. If no gas were present anymore, no convection or conduction could take place, thus slowing down thermal exchange drastically.

In another embodiment, the pump is connected to a processor arranged to evacuate the load lock volume by the pump from a first pressure to a second pressure, the processor being also arranged to control the temperature conditioned structure such that the object is at a predetermined temperature that is higher than the desired temperature when the processor starts depressurizing the load lock volume.

During depressurization of the load lock, the object will obtain a lower temperature due to adiabatic processes. However, this temperature decrease can be estimated beforehand. By, thus, providing the object with a higher temperature than the desired temperature, the decrease of the temperature of the object may be substantially the estimated temperature decrease necessary to reach the desired temperature at the end of the depressurization process.

Another measure to reduce the decrease of temperature due to depressurization of the load lock may be to decrease the gas volume adjacent the surface of the object positioned on the support unit.

The present invention is also directed to a lithographic projection assembly, comprising a load lock as defined above. The lithographic projection assembly may comprise a lithographic apparatus that typically comprises:

a radiation system for supplying a projection beam of radiation;

a support structure for supporting a patterning device or patterning structure, the patterning device or patterning structure serving to pattern the projection beam according to a desired pattern;

a substrate table for holding a substrate; and a projection system for projecting the patterned beam onto a target portion of the substrate.

The invention also relates to a supporting structure in a lithographic apparatus, the supporting structure comprising a body for supporting a substrate and comprising a supply line for supplying a gas in a volume between the substrate and the support-structure, the supporting structure being arranged to temperature control the substrate via the gas in the volume.

Finally, the present invention relates to a device manufacturing method, comprising:

providing a substrate that is at least partially covered by a layer of radiation-sensitive material;

providing a projection beam of radiation using a radiation system;

using patterning devices or patterning structures to endow the projection beam with a pattern in its cross-section; and projecting the patterned beam of radiation onto a target portion of the layer of radiation-sensitive material, characterized by providing the substrate through a load lock or a supporting structure as defined above.

According to a further embodiment of the invention, the load lock chamber comprises a top wall and a bottom wall, wherein a depressurization opening is provided in the bottom wall of the load lock chamber, and wherein a venting opening is provided in the top wall of the load lock chamber. By depressurizing from the bottom and venting from the top, the gas flow in the apparatus will be from top to bottom. This means that particles, if present, will be transported by the gas from the upper part of the load lock chamber to the bottom part. The particles will be deposited at the bottom of the load lock chamber or removed from the load lock chamber. In this respect, the venting opening and depressurization opening may be arranged centrally with respect to one or more support units of the load lock, where if there are a plurality of support units they are preferably arranged one above the other. This provides the possibility to use the gas flow created internally in the load lock chamber during depressurization and/or venting for removing particles which might lay on or might adhere to the substrate placed in the load lock chamber. The top wall and/or bottom wall can be fixed but need not be fixed, advantageously the top wall and/or bottom wall are removable for maintenance purposes.

According to a further embodiment of this aspect, the projection chamber is a vacuum chamber and the lithographic projection apparatus comprises vacuum devices for establishing or maintaining a vacuum in the vacuum chamber. By vacuum is meant an absolute pressure of less than $10^5$ Pa (or 1 bar).

Although specific reference may be made in this text to the use of the apparatus according to the invention in the manufacture of ICs, it should be explicitly understood that such an apparatus has many other possible applications. For example, it may be employed in the manufacture of integrated optical systems, guidance and detection patterns for magnetic domain memories, liquid-crystal display panels, thin-film magnetic heads, etc. The skilled artisan will appreciate that, in the context of such alternative applications, any use of the terms "reticle", "wafer" or "die" in this text should be considered as being replaced by the more general terms "mask", "substrate" and "target portion", respectively.

In the present document, the terms "radiation" and "beam" are used to encompass all types of electromagnetic radiation, including ultraviolet (UV) radiation (e.g. with a wavelength of 365, 248, 193, 157 or 126 nm) and extreme ultra-violet (EUV) radiation (e.g. having a wavelength in the range 5-20 nm), as well as particle beams, such as ion beams or electron beams.

As will have become clear, this invention comprises several aspects. Each aspect is isolated from the other aspects an invention, however one or more of the aspects, or parts of the aspects, can according to the invention advantageously be combined with each other.

BRIEF DESCRIPTION OF THE DRAWINGS

Embodiments of the invention will now be described, by way of example only, with reference to the accompanying schematic drawings in which corresponding reference symbols or numbers indicate corresponding parts, and in which:

FIG. 8b shows a top view of the support unit shown in FIG. 8a;

FIG. 9b shows a three dimensional view of the support unit shown in FIG. 9a;

DETAILED DESCRIPTION

Figure 1:
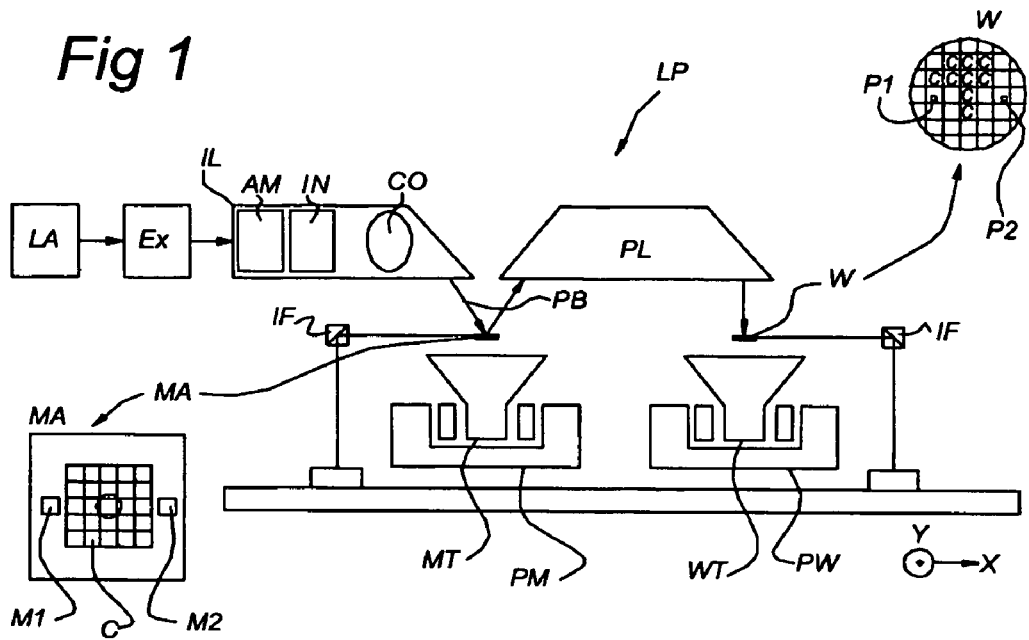
FIG. 1 schematically depicts a lithographic projection apparatus according to an embodiment of the invention.

FIG. 1 schematically depicts a lithographic projection apparatus (LP) according to a particular embodiment of the invention. The description of this drawing is meant to illustrate the various parts of a lithographic projection apparatus. The apparatus comprises:

a radiation system Ex, IL, for supplying a projection beam PB of radiation (e.g. EUV radiation). In this particular case, the radiation system also comprises a radiation source LA;

a first object table (mask table) MT provided with a mask holder for holding a patterning device, illustrated in the form of the mask MA (e.g. a reticle), and connected to first positioning devices PM for accurately positioning the mask with respect to item PL;

a second object table (substrate table) WT provided with a substrate holder for holding a substrate W (e.g. a resist-coated silicon wafer), and connected to second positioning devices PW for accurately positioning the substrate with respect to item PL; and a projection system ("lens") PL (e.g. a reflective mirror system) for imaging an irradiated portion of the mask MA onto a target portion C (e.g. comprising one or more dies) of the substrate W.

As here depicted, the apparatus is of a reflective type (i.e. has a reflective mask). However, in general, it may also be of a transmissive type, for example (with a transmissive mask with a refractive lens system). Alternatively, the apparatus may employ another kind of patterning device or patterning structure, such as a programmable mirror array of a type as referred to above.

The source LA (e.g. a plasma source) produces a beam of radiation. This beam is fed into an illumination system (illuminator) IL, either directly or after having traversed conditioning devices, such as a beam expander Ex, for example. The illuminator IL may comprise adjusting device AM for setting the outer and/or inner radial extent (commonly referred to as σ-outer and σ-inner, respectively) of the intensity distribution in the beam. In addition, it will generally comprise various other components, such as an integrator IN and a condenser CO. In this way, the beam PB impinging on the mask MA has a desired uniformity and intensity distribution in its cross-section.

It should be noted with regard to FIG. 1 that the source LA may be within the housing of the lithographic projection apparatus (as is often the case when the source LA is a mercury lamp, for example), but that it may also be remote from the lithographic projection apparatus, the radiation beam which it produces being led into the apparatus (e.g. with the aid of suitable directing mirrors); this latter scenario is often the case when the source LA is an excimer laser. The current invention and claims encompass both of these scenarios.

The beam PB subsequently intercepts the mask MA, which is held on a mask table MT. Having traversed the mask MA, the beam PB passes through the lens PL, which focuses the beam PB onto a target portion C of the substrate W. With the aid of the second positioning device PW (and interferometric measuring device IF), the substrate table WT can be moved accurately, e.g. so as to position different target portions C in the path of the beam PB. Similarly, the first positioning device PM can be used to accurately position the mask MA with respect to the path of the beam PB, e.g. after mechanical retrieval of the mask MA from a mask library, or during a scan. In general, movement of the object tables MT, WT will be realised with the aid of a long-stroke module (coarse positioning) and a short-stroke module (fine positioning), which are not explicitly depicted in FIG. 1. However, in the case of a wafer stepper (as opposed to a step-and-scan apparatus) the mask table MT may just be connected to a short stroke actuator, or may be fixed. Mask MA and substrate W may be aligned using mask alignment marks M1, M2 and substrate alignment marks P1, P2.

The depicted apparatus can be used in two different modes:

1. In step mode, the mask table MT is kept essentially stationary, and an entire mask image is projected in one go (i.e. a single "flash") onto a target portion C. The substrate table WT is then shifted in the x and/or y directions so that a different target portion C can be irradiated by the beam PB; and 2. In scan mode, essentially the same scenario applies, except that a given target portion C is not exposed in a single "flash". Instead, the mask table MT is movable in a given direction (the so-called "scan direction", e.g. the y direction) with a speed v, so that the projection beam PB is caused to scan over a mask image; concurrently, the substrate table WT is simultaneously moved in the same or opposite direction at a speed V=Mv, in which M is the magnification of the lens PL (typically, M=¼ or ⅕). In this manner, a relatively large target portion C can be exposed, without having to compromise on resolution.

Figure 2:
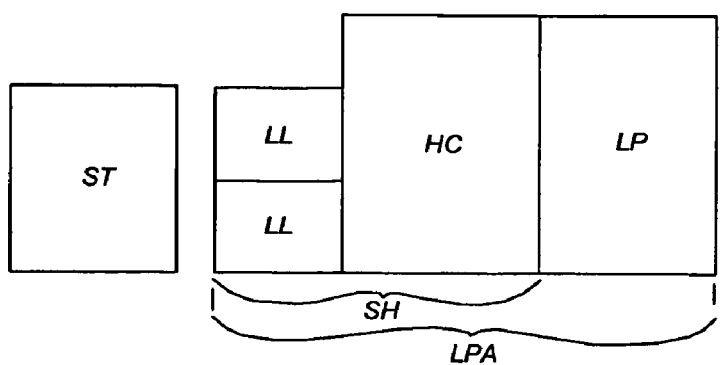
FIG. 2 schematically depicts the general layout of the separate modules of a lithographic projection assembly according to an embodiment of the invention.

FIG. 2 schematically depicts an illustrative layout of the separate modules of a lithographic projection assembly LPA according to an embodiment of the invention.

The layout comprises:

a plurality of load locks LL to facilitate transfer of substrates between a first environment and a second environment. The second environment, prevailing in the modules HC and LP, has a lower pressure than the first environment;

a handler chamber HC that is provided with a pre-processor, such as a pre-alignment unit and/or a thermal treatment unit, for pre-processing of the substrates and transport device for transferring substrates from the load locks LL to the pre-processor and further from the pre-processor to a load position in the lithographic projection apparatus LP and in reverse direction from an unload position in the lithographic projection apparatus LP to the load locks LL.

a lithographic projection apparatus LP, as described in more detail above.

The load locks together with the handler chamber are commonly designated by substrate handler SH or wafer handler in case wafers are being processed.

The lithographic projection apparatus comprises a projection chamber, which comprises inter alia the substrate table WT and typically the second positioning device PW from FIG. 1 and evacuating arrangement for evacuating or lowering the pressure (here both referred to as depressurizing) in the projection chamber. The functioning of the load locks and handler chamber are described in more detail below.

Figure 3:
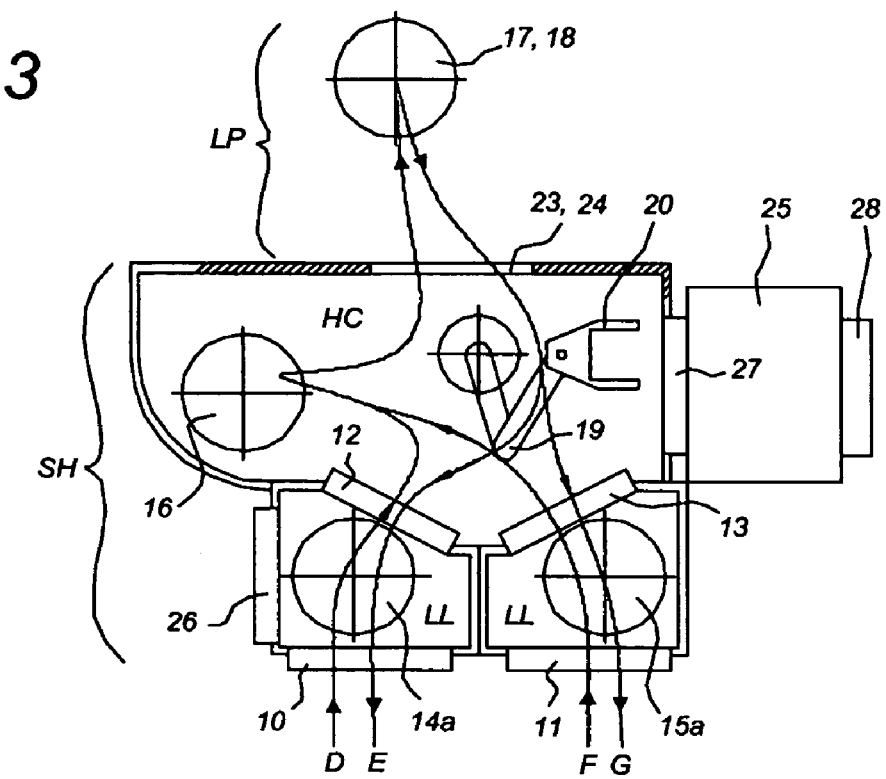
FIGS. 3 and 4 depict substrate handlers in a lithographic projection assembly according to embodiments of the invention.
Figure 4:
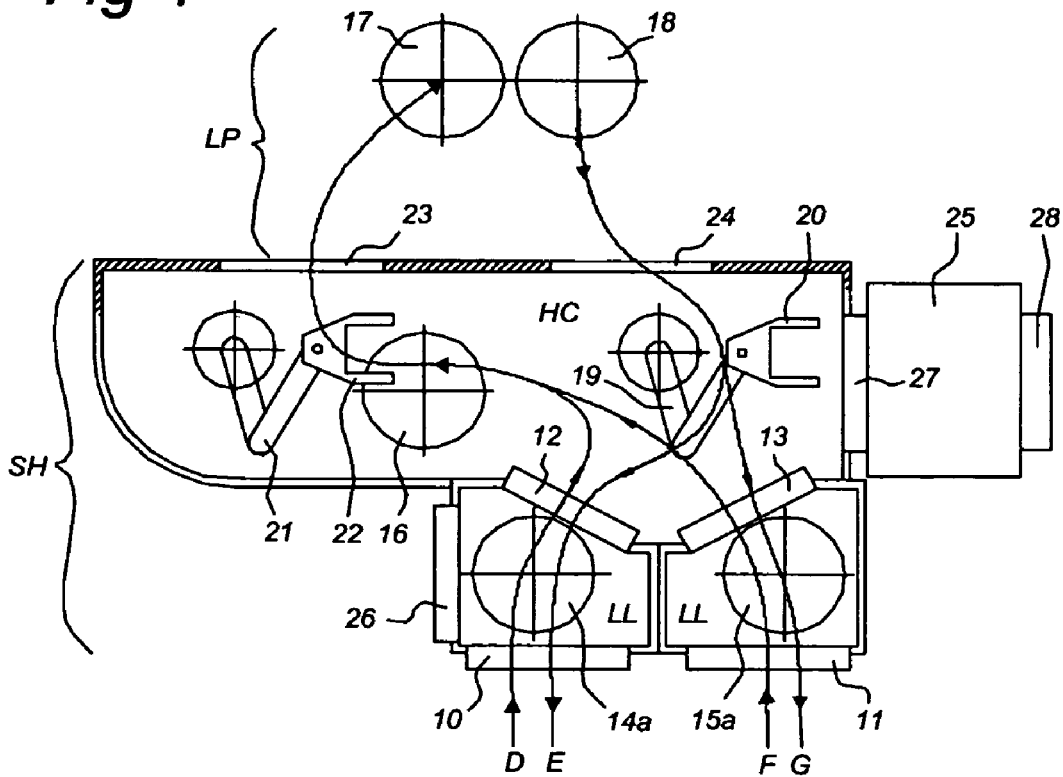

FIG. 3 and FIG. 4 depict a lithographic projection assembly according to a first and second embodiment, respectively, of the invention. In both Figures the following modules will be recognized:

two load locks LL the handler chamber HC, in combination with two load locks LL designated by substrate handler SH or wafer handler the lithographic projection apparatus LP, comprising a projection chamber.

In the latter module LP the arrangement is not shown in detail but can be understood by example from FIGS. 1 and 2.

Adjacent to the load locks LL opposite to the handler chamber HC another module will typically be present such as a substrate track ST (see FIG. 2), that is equipped for supply and removal of substrates to and from the load locks LL.

In each of the load locks LL a door 10,11 is present, which door is meant for allowing transfer of substrates between the first environment and the load lock LL. At the opposite side thereof, each load lock is provided with a door 12,13 for allowing transfer of substrates between the load lock LL and the handler chamber HC. The second environment will prevail in the handler chamber HC and in the lithographic projection apparatus LP during the projection process. Each door 10, 11, 12, 13 is equipped to close off the interior of the respective load lock in a gas-tight manner.

Figure 5:
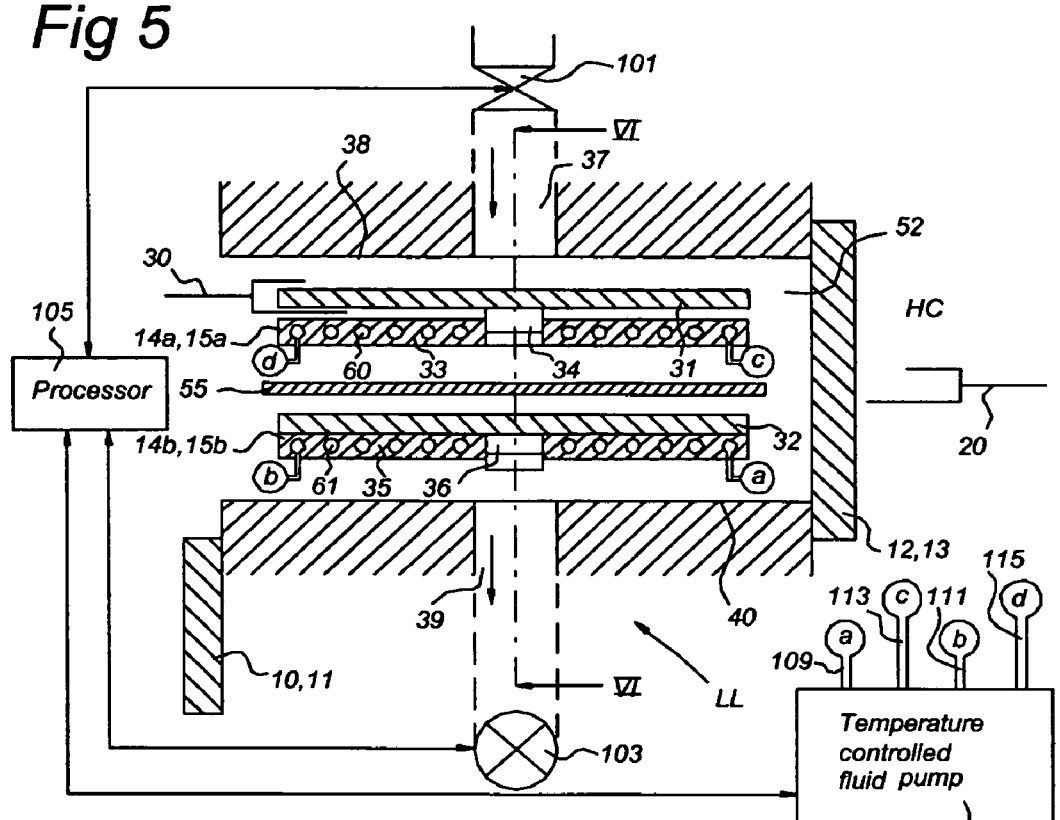
FIG. 5 depicts a cross-section of a load lock according to an embodiment of the invention.
Figure 6:
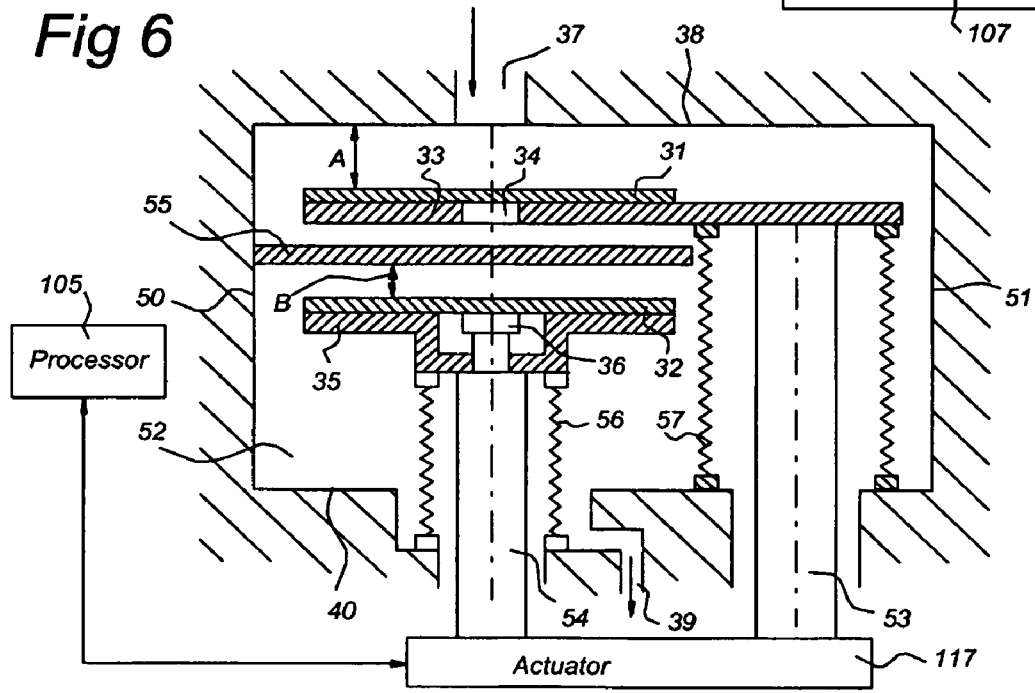
FIG. 6 depicts a cross-section perpendicular to the cross-section of FIG. 5 (view line VI-VI) of a load lock according to an embodiment of the invention.

Each load lock has a substrate support unit 14a, 15a to support a substrate. Not shown in FIG. 4 is a second substrate support unit 14b, 15b. The first and second substrate support units are illustrated in FIGS. 5 and 6 and thus explained hereafter.

The second environment has a lower pressure than the first environment. When the lithographic projection apparatus LP uses EUV radiation for example, the second environment will be a vacuum environment. The projection chamber in this case is a vacuum chamber. To establish a vacuum atmosphere the lithographic projection assembly of both embodiments may be provided with a vacuum arrangement to establish or maintain a vacuum (not shown).

Alternatively the second environment can also be a special gas environment, such as a nitrogen environment.

In order to transfer substrates between the first environment and a second environment with lower pressure without damaging vital parts due to uncontrolled and potentially damaging gas flow, just one door of a load lock LL will be opened at a time. Upon transferring a substrate from the substrate support unit 14a, 15a to the first environment, the load lock LL will be vented first before opening the respective door 10, 11, while upon transferring a substrate from the substrate support unit 14b, 15b to the second environment, the load lock will first be pumped or otherwise lowered to the correct pressure level before opening the respective door 12, 13.

In the handler chamber HC a pre-processing position 16 is present, where a pre-alignment unit and/or a thermal treatment unit are disposed (not shown). Pre-alignment at the pre-processing position 16 is needed in order to reach an optimal level of accuracy in positioning of the substrate on the substrate table WT. A next position is the load and unload position 17, 18 in the lithographic projection apparatus LP. At this position the substrate is placed on or removed from the substrate table WT from FIG. 1. In case wafers are being processed this table is considered a wafer stage. Applying a thermal treatment unit at position 16 is advantageous in order to maintain a controlled temperature across the substrate.

In FIG. 4, unload position 18 is disposed apart from load position 17 in the lithographic projection apparatus LP. This in contrast to the embodiment of FIG. 3 in which both positions 17 and 18 happen to coincide.

Upon transferring substrates between the handler chamber HC and the lithographic projection apparatus LP and vice versa, a substrate passes an entrance and exit 23, 24 disposed apart from each other. Comparable with the difference in the previous paragraph, the entrance and exit 23, 24 between the handler chamber and load and unload position in FIG. 3 happen to coincide.

Another difference between the first and second embodiment of FIG. 3 and FIG. 4 relates to the transport arrangement. The first embodiment of FIG. 3 comprises one manipulator 19 having a gripper 20, while the second embodiment depicted in FIG. 4 comprises next to the first manipulator 19 a second manipulator 21, also having a gripper 22. Both manipulators are in these embodiments a robot, a SCARA robot, but also other robots or other manipulators are conceivable.

The robots are adapted for the following transfer operations:

picking a substrate from one of the load locks LL and transferring the substrate to the pre-processor 16; and/or picking a substrate from the pre-processor 16 and transferring the substrate to the load position 17; and/or picking a substrate from the unload position 18 and transferring the substrate to the substrate transport position 14, 15 of a load lock LL.

Enhanced throughput of substrates in the embodiment of FIG. 3 can be reached by combining two or more of the three operations mentioned above before either venting or depressurizing one of the load locks LL.

One will readily understand that the possibilities for combination of the operations mentioned above is drastically enhanced upon using two robots instead of one robot, as is the case in the embodiment of FIG. 4.

The most logical sequence of transfer operations will depend on the mode of operation of the lithographic projection assembly LPA:

a start-up phase, in which no transfer of a substrate from the unload position 18 to a load lock LL will be necessary and one or more substrates are transferred into the handler chamber and the lithographic projection apparatus;

a steady state operation in which there is even transfer to and from the load position 17 and unload position 18 respectively;

a run empty phase, in which no transfer from a load lock LL to the pre-processing position 16 or to a load position 17 occurs and one or more substrates are transferred out of the handler chamber and the lithographic projection apparatus.

According to an embodiment of the invention, each load lock LL is provided with a first 14a, 15a and a second substrate support unit 14b, 15b (not shown in detail in FIGS. 3 and 4, but shown in FIGS. 5 and 6). An additional support unit enhances the possibilities to combine the mentioned transfer operations, because the additional support unit can act as a kind of buffer for incoming and outgoing substrates.

In both the first and second embodiment the load locks LL together with the corresponding robots 19, 21 both are formed as so-called two-way load locks, meaning that each load lock is accessible by both a robot(s) in the handler chamber and a robot(s) from, e.g., the substrate track ST in such a way that substrates can be transferred past the doors 10,11,12,13 in both directions. This is indicated by lines D,E,F,G provided with arrow heads in FIGS. 3 and 4. This configuration can enhance the throughput of substrates. Embodiments of the lithographic projection assembly LPA according to the invention, where one load lock LL is for incoming substrates and the other load lock LL for outgoing substrates are also feasible. Such an embodiment however reduces the flexibility for combination of the transfer operations, but at the same time reduces the requirements with respect to the operational reach of the robots.

In both embodiments the substrate handler SH is optionally provided with a third load lock 25 for transferring substrates between a third environment and the second environment. On opposite sides of the third load lock 25 doors 27,28 are provided. Door 27 connects the interior of the third load lock 25 to the handler chamber HC. External door 28 connects the interior of the third load lock to the environment exterior to the substrate handler SH.

This third load lock 25 is disposed at a side of the handler chamber that is freely accessible and it enhances the flexibility and application possibilities of the lithographic projection assembly LPA, e.g. by using this third load lock as a buffer in case a substrate should be removed or in case both substrate support units of the first and second load lock 14a,14b,15a, 15b are already taken. Furthermore it can be used to facilitate repair and maintenance of the handler chamber HC and/or the lithographic projection apparatus LP. It is noted that the third environment can be the same as the first environment, but can also be different from the first environment.

In FIGS. 3 and 4 one of the load locks LL comprises an optional external door 26, that is disposed at a side that is freely accessible. This door 26 is meant for transferring substrates or other objects directly from a third environment (which can be the same as the first environment) to the load lock. Furthermore it can be used for repair and maintenance of the corresponding load lock. It is also possible to provide both load locks with an external door 26 or to dispose the external door 26 at the other load lock LL.

FIG. 5 depicts a cross-section of a load lock according to an embodiment of the invention.

Several parts in FIG. 5 can be recognised from the previous two figures:

load lock door 10, 11 for connection with the first environment load lock door 12, 13 for connection with the second environment a first substrate support unit 14a, 15a in the upper part of the load lock a second substrate support unit 14b, 15b in the lower part of the load lock the gripper 20 from a robot in the handler chamber HC.

At the left side of FIG. 5 a gripper 30 is depicted that is equipped to transfer substrates between the load lock LL and the first environment in, e.g., a substrate track system. This gripper 30, like gripper 20, can pick up and deliver substrates to and from the various substrate support units. In FIG. 5 a substrate 31 has just been placed on the first substrate support unit 14a by gripper 30, while a second substrate 32 is supported by the second substrate support unit 14b, 15b.

Both substrate support units 14a,14b,15a,15b comprise a support plate 33, 35 and an ejector pin 34, 36. The ejector pin 34,36 facilitates a displacement between a substrate and the support plate 33, 35 so that a part of a gripper can be interposed between the substrate and the support plate, whether in delivering a substrate to a substrate support unit or in removing a substrate from a substrate support unit. After the gripper 30 has delivered the substrate 31 and is itself moved outside the load lock the ejector pin 34,36 and/or the support plate 33,35 move with respect to each other to enable the support plate 33,35 to support the substrate, as is shown for the lower substrate 32 in FIG. 5. Similarly, the ejector pin 34, 36 and/or the support plate 33, 35 can move with respect to each other in order to allow a part of the gripper 30, 20 to be interposed between the substrate and the support plate so that the gripper picks and transfers the substrate out of the load lock.

In FIG. 5, just one ejector pin 34,36 per support plate is depicted, but in most cases the support plate will have three or more ejector pins.

Between support plates 33,35 an intermediate plate 55 is disposed, the function of which will be described later.

With FIG. 5 an advantage of providing two substrate support units is easily explained. In the situation shown in FIG. 5, the load lock LL is vented to the first environment and a first substrate 31 has just been delivered to one of the first substrate support units 14a, 15a while a second substrate—coming from the handler chamber HC and thus already present before venting the load lock—is supported on one of the second substrate support units 14b, 15b. From this situation the following operations can take place:

move gripper 30 outside the load lock LL;

move support plate 33 and/or ejector pin 34 with respect to each other in order to let the support plate 33 fully support the substrate 31;

move support plate 35 and/or ejector pin 36 with respect to each other in order to displace the second substrate 32 from the support plate 35;

move gripper 30 or possibly a second gripper (not shown) to the second substrate 32 and subsequently let that gripper pick the second substrate 32;

move gripper 30 or possibly the second gripper (not shown) with second substrate 32 outside the load lock;

close the door 10, 11 and depressurize the load lock.

The advantage is that substrates can both be transferred to and from the load lock LL in between two successive venting and depressurizing operations.

Another advantage of the use of a load lock having two support positions is, that it is possible to exchange a substrate without the need of a buffer outside the load lock.

One will readily understand that a comparable sequence of operations is possible in order to transfer two substrates between the handler chamber HC and the load lock LL using the gripper 20.

Further in FIG. 5 a top wall 38 comprising a venting opening 37 is depicted on the one hand and a bottom wall 40 comprising an depressurizing opening 39 on the other. The venting opening 37 is connected to a gas supply 101 whereas the depressurizing opening 39 is connected to a pump 103 (or other suitable depressurizing mechanism). Both the gas supply 101 and pump 103 are connected to a processor 105 that is arranged to control their operation. The processor 105 is depicted in FIG. 5 (and others) as a single unit. However, the processor 105 may be implemented by several processor units operating together, e.g., in a master-slave configuration. The processor 105 may be provided with suitable software, however, the processor 105 may also be based (in part) on analogue and/or digital techniques.

An advantage of this configuration of the venting opening 37 and the depressurizing opening 39 as shown in FIG. 5 is, that the gas flow in the load lock LL is always from top to bottom, which helps to prevent airborne particles from landing on the unsupported surface of the substrate, as the particles will be transported to the bottom wall 40 of the load lock LL.

FIG. 5 further shows a temperature control arrangement integrated with the support plates 33, 35 in order to influence and in particular stabilise the temperature of the substrates. This arrangement, by way of example, comprises lines 60,61, such as channels, tunnels or tubes, disposed in the support plate 33, 35 and a fluid pumping system for pumping temperature controlled fluid through the lines. The support plates 33,35 can be subjected to different temperature treatments. In FIG. 5 it is shown that the lines 60, 61 are integrated in the respective support plates 33, 35. This is however not necessary. The essence is that the lines 60, 61 are in good thermal contact with the respective support plates 33, 35.

As shown in FIG. 5, a temperature controlled fluid pump 107 is provided that is connected to the processor 105 that in turn is arranged to control the operation of the temperature controlled fluid pump 107. This is only schematically depicted in FIG. 5 for reasons of illustrative simplicity. The temperature controlled fluid pump 107 is connected to lines 60 with a supply line 113 and a drain line 115, and to lines 61 with a supply line 109 and a drain line 111, for supplying temperature controlled fluid to the support plates 33, 35, respectively, and then draining the fluid to temperature controlled fluid pump 107. The temperature controlled fluid pump 107 is arranged to provide the fluid, when being supplied to the supply lines 109, 113, with a predetermined desired temperature, that may be received from the processor 105.

An alternative is to dispose a temperature control arrangement in one or more of the walls, e.g. walls 38, 40, 50, 51 and/or doors 10, 11, 12, 13, of the load lock chamber, which will be less effective in stabilising the substrate temperature, but results in a more simple construction. This has not been shown in FIG. 5. However, FIG. 7, that will be discussed hereinafter, shows lines 125 in outer walls 38, 40, through which temperature controlled fluid can flow, in a way similar as through lines 60, 61. Lines 125 may include channels or tubes.

FIG. 6 depicts a cross-section according to view line VI-VI in FIG. 5 of a load lock LL according to an embodiment of the invention.

Instead of the load lock doors, in this cross-section, sidewalls 50 and 51 are depicted. These walls together with bottom wall 40 and top wall 38 define load lock chamber 52. In addition to ejector pins 34,36, support plates 33,35 and venting and depressurizing openings 37,39, this embodiment comprises a displacing arrangement 53 and/or 54. Bellows 56, 57 are used as seals. The displacing arrangement comprises two shafts operated by an actuator 117 which itself is connected to the processor 105. The processor 105 controls the operation of the actuator. Of course there may be two separate actuators, one for each shaft.

These displacing arrangements firstly respectively function to decrease (or increase) the distance A between the substrate 31 and the top wall 38 and the distance B between the substrate 32 and the intermediate plate 55, prior to depressurization of the load lock chamber 52. Secondly the arrangement functions to increase (or decrease) the distance between the support plates 33,35 and the top wall 38 and the intermediate plate 55, respectively, prior to delivering a substrate or picking a substrate from a support plate. In that sense, the intermediate plate 55 functions as a protection unit to protect a substrate against gas flow along its surface as much as possible during depressurizing the load lock chamber 52. The less gas flow along its surface, the less its temperature will fall due to adiabatic cooling.

As discussed earlier, an advantageous effect of decreasing the distance A and B is that the volume of gas present around a substrate is reduced. With a reduced volume of gas adiabatic effects during depressurizing of the load lock chamber 52, and with that temperature effects on the substrate, are also reduced.

In order to avoid any contact between substrates and the top wall or the intermediate plate the distances A and B are at least 100 μm. An additional reason of this is to avoid increase in pumping time, which might arise when too small gaps exist in the load lock chamber.

After depressurizing the load lock chamber 52 and opening door 12,13, the distance A,B is increased to establish adequate room for the gripper 20 to pick and remove or deliver a substrate.

Instead of moving the support plates 33,35 respectively the substrates 31,32 towards a fixed top wall 38 respectively the intermediate plate 55, an alternative is to provide movable (ceiling) plates (not shown) that are moved towards fixed or movable support plates or substrates. For the first support plate 33 with substrate 31 such a ceiling plate will be disposed at the top wall 38 and for an appropriate movement arrangement is provided, for example disposed in the top wall 38, while for the second support plate 35 with substrate 32 the intermediate plate 55 functions as a ceiling plate. For the latter an appropriate movement arrangement can be disposed for example in a sidewall 50, 51.

In FIG. 6 both substrate support units 14a,14b,15a,15b are movable. Embodiments where only one of both substrate support units is movable are also feasible. Such embodiments are especially advantageous when one substrate support unit is (for the larger part) reserved for outgoing wafers, for which a close temperature control is less critical. According to an embodiment in this respect, the upper substrate support units 14a, 15a are movable, whilst the lower substrate support units 14b, 15b are fixed (i.e., for example, the bellow 56 is superfluous and displacing arrangement 54 can be replaced by a fixed rod). However, it is also feasible, that the upper substrate support units 14a, 15a are fixed, whilst the lower substrate support units 14b, 15b are movable.

In an alternative embodiment it is also feasible to integrate the displacing arrangement 53,54 in the walls 50,51.

In the embodiment of FIG. 6 the evacuating opening 39 is integrated in the configuration of the displacing arrangement 54.

Figure 7:
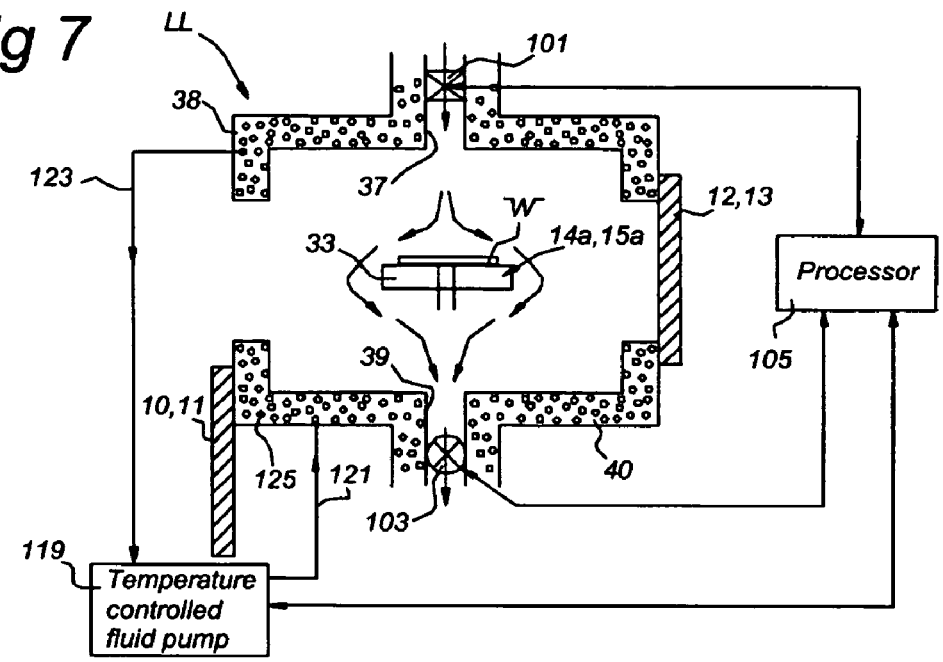
FIG. 7 depicts a cross-section of a load lock according to an embodiment of the invention.

FIG. 7 shows a cross-section through an alternative load lock LL according to a further embodiment of the invention. Whereas in former figures two support plates 33, 35 were shown, FIG. 7 shows an embodiment in which there is only one support plate 33. The upper and lower load lock walls 38, 40 are shown to comprise lines, e.g., tubes, channels or pipes 125. The lines 125 are connected to a temperature controlled fluid pump 119 by a supply line 121 and a drain line 123. Of course, there may be more supply lines and/or drain lines than just one. The temperature controlled fluid pump 119 is connected to the processor 105. The processor 105 is arranged to control the operation of the temperature controlled fluid pump 119. In operation, the temperature controlled fluid pump 119 will supply a fluid with a controlled temperature to one or more of the lines 125 through the supply line 121. Moreover, the fluid, after having passed the lines 125, will be returned to the temperature controlled fluid pump 119 through drain line 123. The processor 105 is arranged such that the temperature controlled fluid pump 119 provides a fluid with a desired temperature. Of course, the temperature controlled fluid pump 119 may be controlled by another processor than processor 105. It may even be a stand-alone unit not connected to a separate processor external to the temperature controlled fluid pump 119.

As shown, the venting opening 39 is arranged substantially centrally in the lower wall 40, whereas the support plate 33 is arranged substantially centrally above the venting opening 39. Thus, when pump 103 is depressurizing the interior of the load lock LL, gas present within the load lock, and above the surface of the substrate W, exhibits a radial flow pattern, i.e., flows from the centre of the substrate W towards the edge, as is indicated in FIG. 7 by arrows. An outwardly directed radial flow of the gas across the (upper) surface of the substrate W will result in the removal of contamination that is present in that area and will at least prevent contamination from falling on the upper surface. With such a flow pattern, there is less chance for contamination particles to adhere on the substrate W during depressurizing.

Figure 8A:
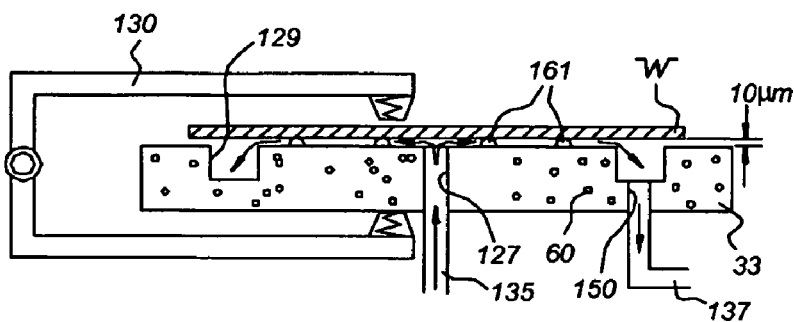
FIG. 8a shows a cross-section through a support unit for supporting a substrate according to an embodiment of the invention.
Figure 8B:
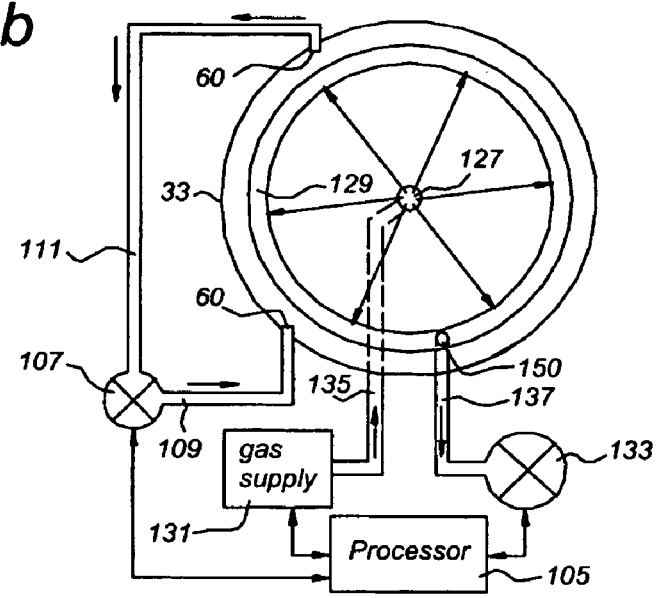

FIGS. 8a and 8b show an alternative support plate 33. The support plate 33 is provided with a support structure 161 (such as pimples or concentric barbs) to support substrate W from a surface of support plate 33. The support structure 161 defines a volume between the support plate 33 and substrate W. The support plate 33 is provided with lines 60, like in FIG. 5. Moreover, the support plate 33 is provided with a supply groove 127 and a drain groove 129. The supply groove 127 is arranged to supply an amount of gas between the lower surface of the substrate W and the support plate 33. To that end, the supply groove 127 is connected to a supply line 135. The drain groove 129 is arranged for draining some or all that amount of gas, as will be explained hereafter. To that end, the drain groove 129 is connected to a drain line 137. The support structure 161 should be configured to permit relative easy flow of gas from the supply groove 127 to the drain groove 129.

FIG. 8a also shows that a clamp 130 may be applied. The clamp 130 is arranged for clamping the substrate W against the plate support structure 161 of the support plate 33. This is especially advantageous when depressurizing the load lock LL when the gas flow in the load lock LL may cause the substrate W to move undesirably. In practice, this clamp 130 will be connected to the processor 105 (or another processor) such that the processor 105 controls the operation of the clamp 130. This connection has not been shown. The clamp 130 may also be implemented as an electrostatic clamp.

FIG. 8b shows a top view of the support plate 33 shown in FIG. 8a. The supply groove 127 is located in the centre of support plate 33. The drain groove 129 is shown to have a circular shape distal from and surrounding the supply groove 127. However, the invention is not restricted to these specific shapes or positions. The supply groove 127 is connected to a gas supply 131 via line 135, whereas the drain groove 129 is connected to a pump 133 via line 137. The gas supply 131 and the pump 133 are connected to processor 105. The processor 105 is arranged to control the operation of the gas supply 131 and pump 133, such that, in use, gas is supplied, maintained and removed in the space between the substrate W and the support plate 33 via supply groove 127 and drain groove 129 such that the pressure is controlled in this space. The gas is drained from this space via drain groove 129 before such gas enters the load lock volume. Typically, most contamination on the substrate W will be located at its edge. By preventing the gas supplied via the supply groove 127 from entering the load lock volume, this contamination at the substrate edge will have no chance of being removed by such gas flow, entering the load lock volume and adhering to the upper surface of the substrate W. Moreover, typically, the pressure of the gas built up by the supply of gas via the supply groove 127 will be 200 to 10,000 Pa (or 2-100 mbar) between the substrate W and the support plate 33.

The supply of gas via the supply groove 127 will, in an embodiment, start at the beginning of depressurizing the load lock LL and stop before the door 12, 13 towards the handling chamber HC will be opened.

The supply of gas between the substrate W and the support plate 33 will provide a thermal bridge between the support plate 33 and the substrate W during depressurization of the load lock LL. Thus, even when there is already a very low pressure within the load lock LL, there is still a good thermal contact between the support plate 33 and the substrate W and the substrate W will be kept substantially at the temperature of the support plate 33 despite adiabatic processes at the surface of the substrate W.

Figure 8C:
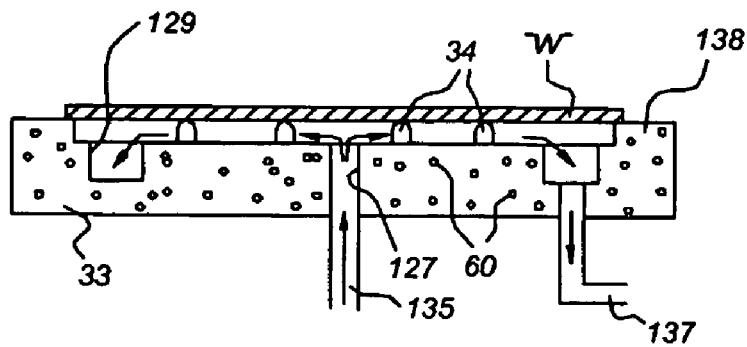
FIG. 8c shows a cross-section through a support unit for supporting a substrate according to an embodiment of the invention.

FIG. 8c shows an alternative embodiment of the arrangement of FIGS. 8a and 8b. The difference between the embodiment of FIG. 8c and FIGS. 8a, 8b is the application of an upstanding rim 138 that is, preferably, circularly shaped. It closes off the volume between substrate W and support plate 33 and may be so high that it engages substrate W to provide better support for substrate W.

Figure 8D:
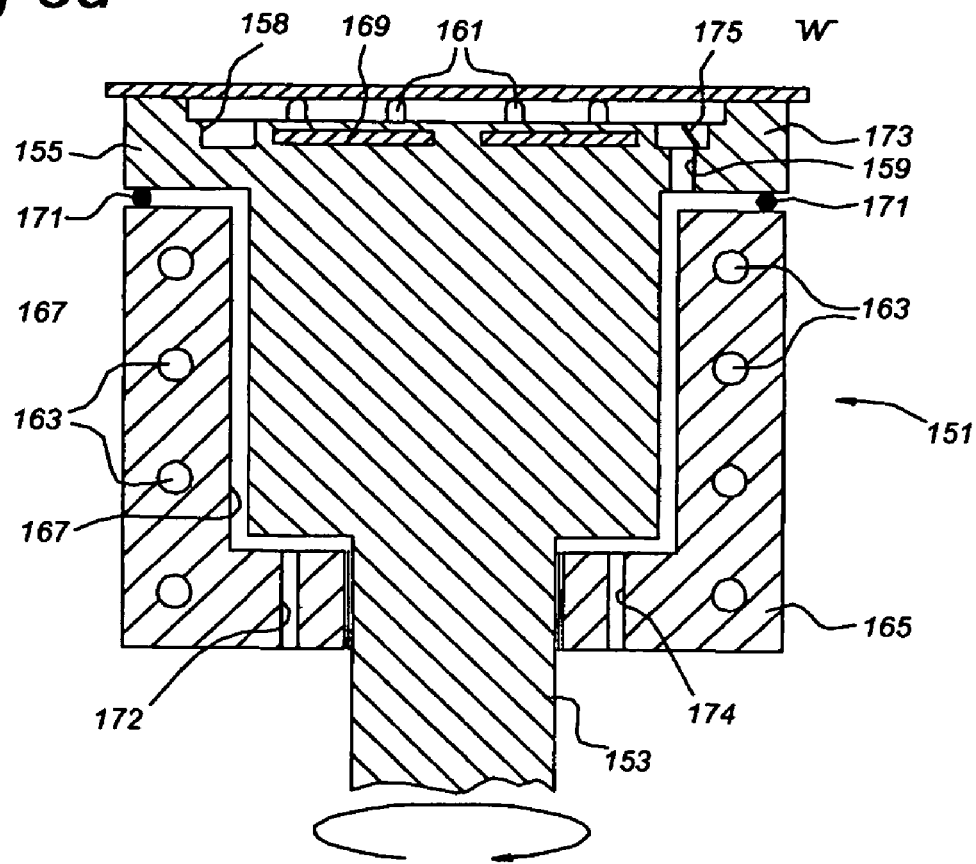
FIG. 8d shows a cross-section of a rotating pre-aligner according to an embodiment of the invention.

The principles of FIGS. 8a-8c can be applied in other environments of an lithographic apparatus than load locks. FIG. 8d shows an application of these principles in a rotating pre-aligner 151, such as at pre-processing position 16. The rotating pre-aligner 151 comprises a rotating body 155 that is provided with a body support structure 161 (such as pimples) for supporting a substrate W from a surface of body 155. At the upper outer edge of body 155 there is a rim 173 for supporting the substrate W and for sealing the volume between the substrate W and the body 155. Like in FIG. 8a, the rim 173 can be omitted. The body 155 has a clamp 169, e.g., an electrostatic clamp, for clamping the substrate W against the body support structure 161. A groove 158 is provided in the body 155 that is open to the volume between the substrate W and the body 155.

The body 155 is connected to a shaft 153 that is connected to a suitable driving unit (not shown) arranged to rotate the body 155.

The body 155 is surrounded by a temperature controlled body 165. The temperature controlled body 165 is provided with lines 163 for transport of a temperature controlled fluid. To that end, the lines 163 are connected to a suitable temperature controlled fluid pump (not shown in this figure). The temperature controlled body 165 and the body 155 are designed such that they define a gap 167 between them. The gap 167 communicates with the groove 158 via a hole 159. The temperature controlled body 165 is provided with an opening 174. The opening 174 is connected to a suitable gas supply (not shown in this figure) for supplying gas to the gap 167 and the volume between the substrate W and the body 155 via hole 159 and groove 158.

The gap 167 is sealed from an external environment by a seal 171 between the rotating body 155 and the temperature controlled body 165. There are no high requirements for this seal 171 since it only needs to seal better than the seal between the rim 173 and the substrate W. Optionally, there may be a further opening 172 in the temperature controlled body 165 to the gap 167. This further opening 172 can be connected to a drain (not shown) to drain gas from gap 167 to reduce gas leakage via seal 171 to the external environment that may be a vacuum.

At the location of the shaft 153, the temperature controlled body 165 may (almost) engage the shaft 153 to provide a seal and prevent gas from flowing away between the shaft and the temperature controlled body 165.

It is observed that, apart from the hole 159 and opening 174, the arrangement from FIG. 8d is rotation symmetric. It is evident that other arrangements may be designed in dependence on specific design choices.

In use, the temperature controlled body 165 is kept at a predetermined temperature by the fluid (such as liquid) flowing through lines 163. Since there is gas present in the gap 167 between the temperature controlled body 165 and the body 155 there is also temperature control of the body 155 via convection and conduction in the gap 167. Moreover, there is gas present in the volume between the body 155 and the substrate W. This gas may have a pressure of 200 to $10^4$ Pa within this volume. The gas in this volume provides for a heat exchange between the body 155 and the substrate W via convection and conduction. Thus, apart from temperature control due to radiation between the body 155 and substrate W, the substrate W is now also temperature controlled by convection and conduction.

Thus, FIG. 8d shows an arrangement with body 155 rotating within the temperature controlled body 165 that itself is stationary. The body 155 need not be provided with hoses for supplying temperature controlled fluid, which would make the arrangement complex and unreliable. The supply of liquid is to the stationary temperature controlled body 165 which can be made by simple stationary hoses in a reliable way.

In an embodiment, the hole 159 is provided with a valve 175 to close the hole 159. This valve 175 is connected to and controlled by processor 105 (not shown in this figure) such that, even if there is no substrate W present there may be gas in the gap 167 and temperature control of the body 155 is possible, e.g., during an exchange of a substrate W. It is also possible to control the valve 175 by the substrate W itself, i.e. such that for example the weight of the substrate W is used to control the opening of the valve 175. Further, in case a separate processor is used, in combination with a direct or indirect measurement of the substrate temperature (e.g. by measuring the size of certain features on the substrate W), the valve 175 may be controlled such that the inflow of gas (molecules) is controlled so that indirectly the temperature of the substrate is controlled.

Figure 9A:
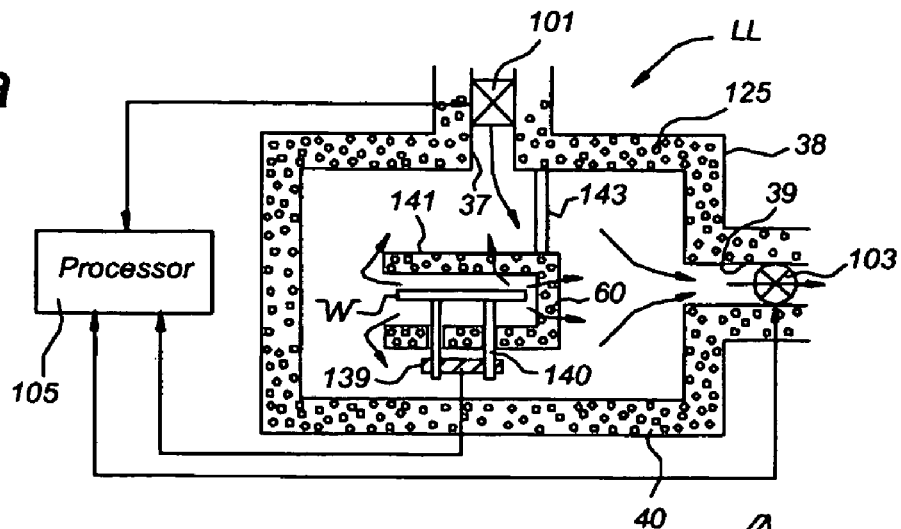
FIG. 9a shows a cross-section through a load lock comprising an alternative support unit for supporting a substrate according to an embodiment of the invention.

FIG. 9a shows a further alternative load lock LL according to an embodiment of the invention. Again, the load lock LL comprises lines 125, as in the embodiment of FIG. 7. For the sake of clarity, the temperature controlled fluid pump 119 and its supply line 121 and drain line 123 are not repeated in FIG. 9a. FIG. 9a shows a special embodiment of a support unit 141 that has, essentially, two functions, i.e., a first function of supporting the substrate W, and a second function of protecting the substrate W against a gas flow across its upper surface as much as possible during depressurization of the load lock chamber. To that end, the support unit 141 is designed to cover substantially the entire substrate W. The support unit 141 is shown to be connected to the upper wall 38 of the load lock LL by a plate 143. However, alternatively, the support unit 141 can be connected to any other part of the load lock LL by any type of devices.

The substrate W is shown to be supported by two pins 140 that are actuated by an actuator 139. Of course, there may be other numbers of pins 140 provided. The support unit 141 may be provided with lines 60, as in the embodiments of FIGS. 5, 8a. Connections of these lines 60 with temperature controlled fluid pump 107 are not shown.

Since the support unit 141 protects the substrate W from the gas flow during depressurization of the load lock chamber as much as possible, the depressurizing opening 39 may be located at any suitable location. Moreover, this depressurizing opening 39 may be made larger than in other arrangements and the amount of gas removed per unit of time may be made larger without having a too strong influence on temperature decrease of the substrate W. An alternative to the embodiment shown in FIG. 9A is to make the walls of the support unit 141 facing the upper side and lower side of the substrate W moveable with respect to each other, so as to further decrease the amount of gas surrounding the substrate W when necessary.

Figure 9B:
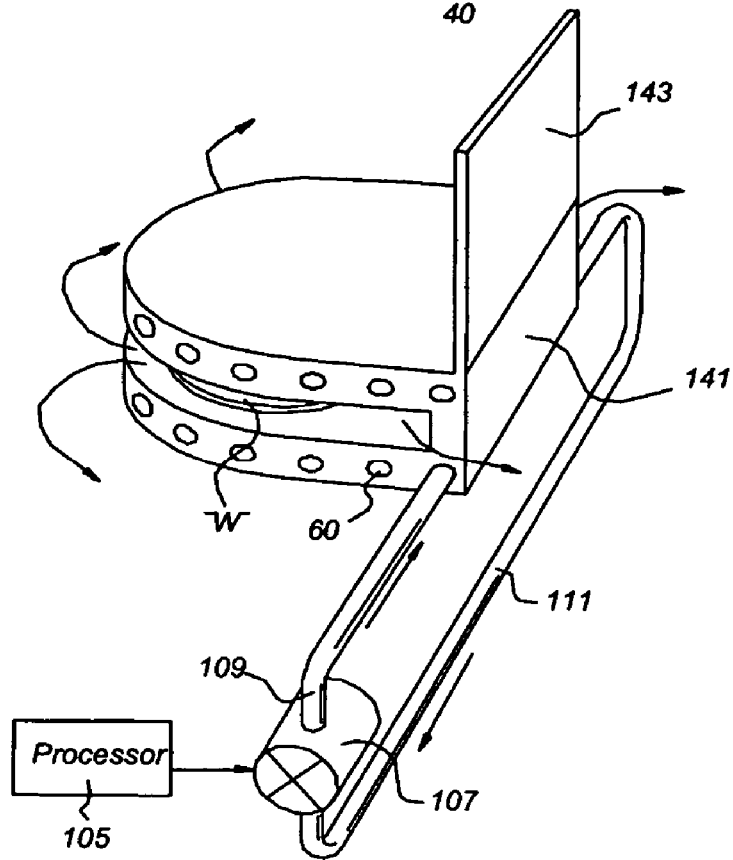

FIG. 9b shows a three dimensional view of an embodiment of the support unit 141, together with its connections to the temperature controlled fluid pump 107, according to an embodiment of the invention. The support unit 141 is preferably provided with a lower half-circular shaped plate and an upper half-circular shaped plate. A space is provided between these two half-circular shaped plates for accommodating the substrate W.

The arrows in FIGS. 9a and 9b show how the gas flow will be near the substrate W when the load lock chamber is depressurized. Essentially, only the gas present in the space between the half-circularly shaped plates will result in a gas flow along the substrate W.

Figure 10A:
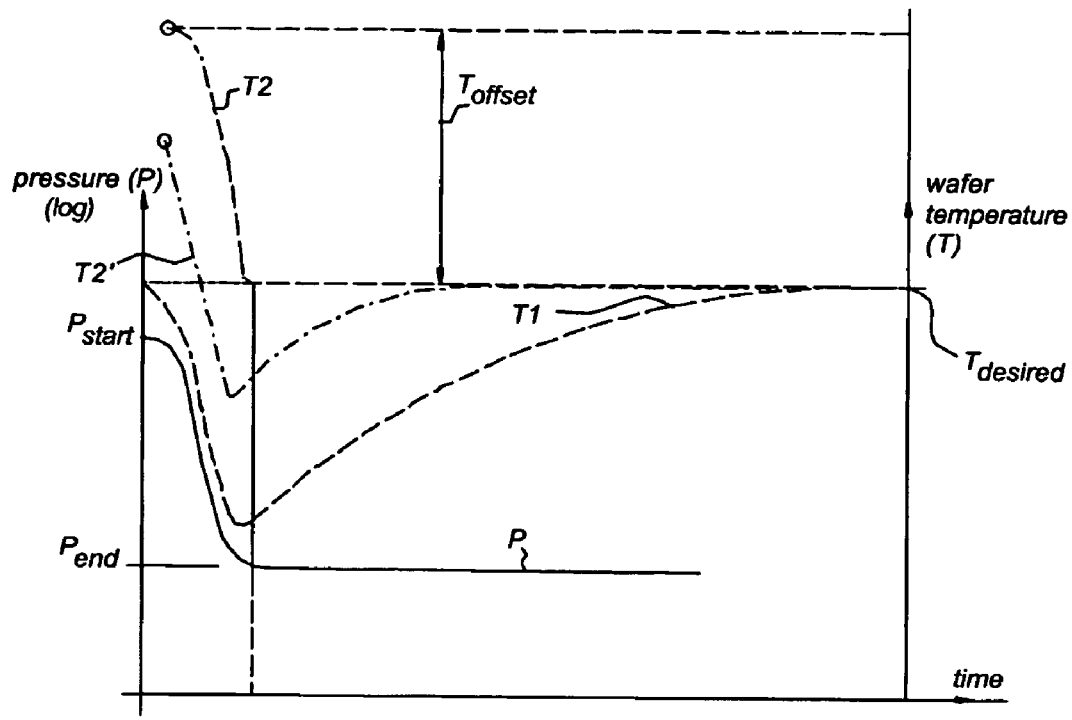
FIGS. 10a and 10b show graphs of temperature control of a substrate in a load lock according to an embodiment of the invention.

FIG. 10a shows the pressure P within the load lock LL as a function of time during depressurization of the load lock chamber. At a certain start time the pressure P equals $P_{start}$. After depressurizing the load lock chamber, the pressure P equals an end pressure $P_{end}$, typically a "vacuum". FIG. 10a also shows the substrate temperature T as a function of time during evacuation of the load lock chamber. The curve indicated with $T_1$ shows the temperature as a function of time without any additional measure taken. That is, when depressurization starts, the temperature of the substrate (wafer) W equals a desired temperature $T_{desired}$. During depressurization of the load lock chamber, the substrate temperature T falls. When the depressurization stops, and the load lock chamber has reached its end pressure $P_{end}$, the temperature of the substrate will rise again. However, since there is so little gas present anymore within the load lock chamber, the substrate temperature rise will go very slowly. Eventually, the temperature $T_1$ will reach the desired temperature $T_{desired}$ again. However, this time needed to reach the desired temperature $T_{desired}$ again may be so long that one cannot wait until this temperature is reached with opening the door 12, 13 to the handling chamber HC.

One way to solve this issue would be to provide the substrate W with an offset temperature $T_{offset}$ relative to the desired temperature $T_{desired}$. This offset temperature $T_{offset}$ is preferably equal to the expected temperature fall of the substrate W due to depressurizing the load lock chamber. Then, after the depressurization has finished, one can directly open the door 12, 13 to the handling chamber HC because the temperature of the substrate W will then have the desired temperature $T_{desired}$. The temperature curve of this alternative embodiment is indicated with $T_2$.

The curve indicated with $T_2^1$ shows the substrate temperature as a function of time when the substrate has a start temperature lower than $T_{desired}+T_{offset}$. Even then, the substrate temperature sooner reaches the desired temperature $T_{desired}$ than without any offset temperature.

Figure 10B:
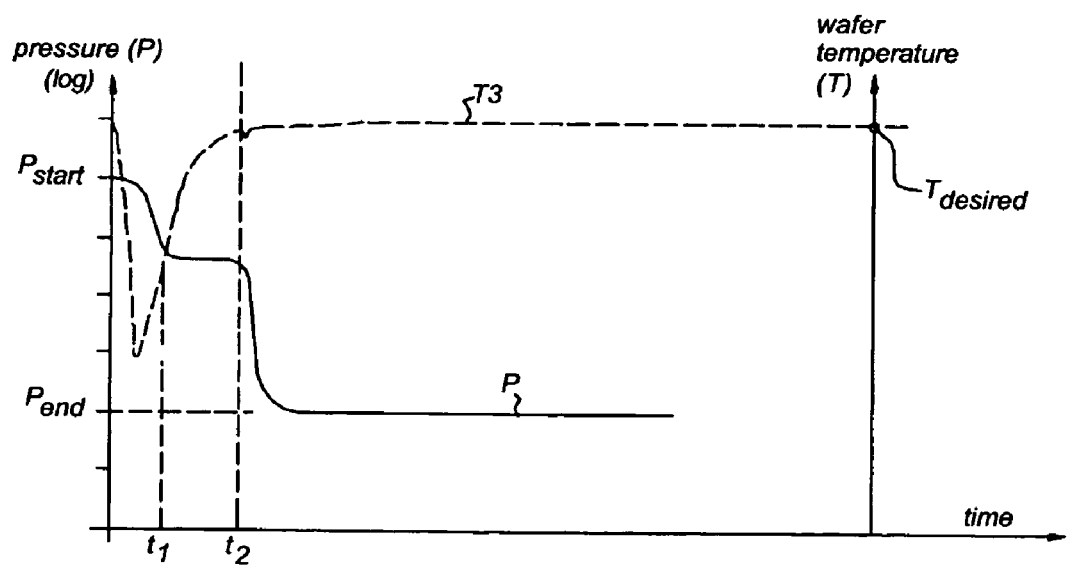

FIG. 10b shows a further alternative to solve this issue. In the embodiment of FIG. 10b, the pressure P is lowered by depressurizing the load lock chamber until a predetermined pressure at time $t_1$. At that time $t_1$, however, there is still enough gas in the load lock chamber to have a proper thermal conduction and convection between the substrate W and a temperature controlled structure in the load lock, like the support plate 33 or one of the walls 38, 40. Thus, at time $t_1$ the temperature of the substrate W, indicated with $T_3$ can rapidly increase towards the starting temperature that equals the desired temperature $T_{desired}$.

After time $t_1$, the depressurization of the load lock chamber is stopped during a predetermined time period, until time $t_2$. At time $t_2$, the temperature $T_3$ of the substrate W has risen so much that it is within a predetermined range from the desired temperature $T_{desired}$. Then, at time $t_2$, the pressure is lowered again, by finishing the evacuation process of the load lock chamber. As indicated, the temperature $T_3$ of the substrate W will, then, fall again until the pressure P has reached its final pressure $P_{end}$. Then, the temperature $T_3$ will rise again until it, finally, reaches the desired temperature $T_{desired}$. However, since there is so little gas present anymore in the load lock chamber, this temperature rise may take a while. However, due to the interrupted depressurization of the load lock chamber, the temperature $T_3$ of the substrate W will remain closer to the desired temperature $T_{desired}$.

Of course, the interruption of the depressurization process of the load lock chamber may be repeated several times, in order for the temperature $T_3$ to remain closer to the desired temperature $T_{desired}$. However, this may be at the cost of loss of time, i.e., at the cost of throughput.

The temperature schemes indicated by $T_2$ and $T_3$ may also be combined, if desired.

While specific embodiments of the invention have been described above, it will be appreciated that the invention may be practiced otherwise than as described. The description is not intended to limit the invention.

The invention may also be used in wafer inspection, temperature control of any (moving) object in vacuum etceteras.

The invention claimed is:

1. A load lock for a lithographic apparatus arranged to transfer an object into and from the lithographic apparatus, comprising:
    an outer wall at least partly defining a load lock volume accommodating a support unit constructed and arranged to support said object when in said load lock at a predetermined pressure, said outer wall being constructed and arranged to permit said object to be transferred between said load lock volume and the lithographic apparatus outside said outer wall;
    a temperature conditioned structure constructed and arranged to control a temperature of said object to a desired temperature at least before said object is transferred from said load lock towards the lithographic projection apparatus; and
    a processor in communication with a pump to depressurize the load lock volume by the pump from a first pressure to a second pressure, the processor also being arranged to control the temperature conditioned structure such that the object is at a predetermined temperature that is higher than said desired temperature when said processor starts depressurizing said load lock volume.

2. A load lock according to claim 1, wherein said temperature conditioned structure includes at least one of said outer wall and said support unit.

3. A load lock according to claim 1, wherein said temperature conditioned structure comprises lines allowing a temperature controlled fluid to flow therethrough.

4. A load lock according to claim 1, wherein said support unit is provided with a supply line and a drain line, said supply line configured to provide a gas between said support unit and said object to provide a thermal bridge between said support unit and said object.

5. A load lock according to claim 1, wherein said pump is connected to an opening arranged centrally underneath the support unit, said object being a substrate and said support unit being arranged to support said substrate substantially above said opening.

6. A load lock according to claim 1, wherein said load lock comprises a volume decreasing device constructed and arranged to decrease said gas volume adjacent a surface of said object positioned on said support unit.

7. A load lock according to claim 6, wherein said support unit comprises a support plate of a size about equal to or larger than said object to be supported thereon,
    wherein a ceiling plate is provided above said support unit, said ceiling plate having a size of about equal to or larger than said object; and
    wherein said volume decreasing device comprises a positioning unit constructed and arranged to:
    decrease the distance between said support plate and said ceiling plate of said support unit prior to and/or during depressurization of said load lock chamber; and
    to increase the distance between said support plate and said ceiling plate prior to said object being removed from or delivered to said support unit.

8. A load lock according to claim 7, wherein said positioning unit is adapted to act on said support plate, while said corresponding ceiling plate is arranged in a stationary manner in said load lock volume.

9. A load lock for a lithographic apparatus arranged to transfer an object into and from the lithographic apparatus, comprising:
    an outer wall at least partly defining a load lock volume accommodating a support unit constructed and arranged to support said object when in said load lock at a predetermined pressure, said outer wall being constructed and arranged to permit said object to be transferred between said load lock volume and the lithographic apparatus outside said outer walk; and
    a temperature conditioned structure constructed and arranged to control a temperature of said object to a desired temperature at least before said object is transferred from said load lock towards the lithographic projection apparatus;
    wherein said support unit is constructed and arranged to substantially protect said object from a gas flow against a surface of said object when said load lock volume is depressurized.

10. A load lock according to claim 9, wherein said support unit is designed to cover substantially said object, in use, and comprises a connection structure constructed and arranged to connect said support unit to said outer wall.

11. A load lock according to claim 10, wherein said support unit has a semi-circular upper surface.

12. A load lock according to claim 10, wherein said support unit has a semi-circular lower surface.

13. A load lock for a lithographic apparatus arranged to transfer an object into and from the lithographic apparatus, comprising:
    an outer wall at least partly defining a load lock volume accommodating a support unit constructed and arranged to support said object when in said load lock at a predetermined pressure, said outer wall being constructed and arranged to permit said object to be transferred between said load lock volume and the lithographic apparatus outside said outer wall; and
    a temperature conditioned structure constructed and arranged to control a temperature of said object to a desired temperature at least before said object is transferred from said load lock towards the lithographic projection apparatus; and
    a processor in communication with a pump to depressurize said load lock volume by said pump to a predetermined first pressure, to wait during a predetermined time period and then to depressurize said load lock volume to a predetermined second pressure.

14. An assembly in a lithographic apparatus, said assembly comprising: a support structure having a body constructed and arranged to support a substrate; and a volume between said substrate and said support structure,
    said body of said support structure including a supply line to supply a gas in said volume between said substrate and said support, and said support structure being constructed and arranged to control the temperature of said substrate via said gas in said volume;

wherein said support structure comprises a stationary body and is arranged to rotate said body in use within said stationary body, said body and said stationary body defining a gap between them that is in communication with said volume, said stationary body having lines allowing a temperature controlled fluid to flow therethrough.

15. An assembly according to claim 14, wherein, in use, said gas in said volume has a pressure in the range of 50 to $1.5^7$ Pa.

16. An assembly according to claim 14, wherein said supporting structure is provided with a clamp to clamp said substrate against said body.

17. An assembly according to claim 14, wherein said body comprises a rim to seal said volume.

18. An assembly according to claim 14, wherein said body comprises lines allowing a temperature controlled fluid to flow therethrough.

19. An assembly according to claim 14, wherein said gap is sealed with a seal, such that said gap may comprise a gas of a higher pressure than an environment of said support structure.

20. An assembly according to claim 19, wherein said stationary body comprises an opening for draining gas present in said gap and reducing gas leakage via said seal.

21. An assembly according to claim 14, wherein said supply line is provided with a valve to close said supply line when no substrate is present.

22. A lithographic projection assembly comprising:
a radiation system constructed to provide a beam of radiation;
a patterning device serving to pattern said beam of radiation according to a desired pattern and form a patterned beam;
a projection system that projects said patterned beam; and
a load lock arranged to transfer an object into and from a lithographic apparatus, said load lock comprising:
an outer wall at least partly defining a load lock volume accommodating a support structure constructed and arranged to support the object when in said load lock at a predetermined pressure, said outer wall being constructed and arranged to permit the object to be transferred between said load lock volume and said lithographic apparatus outside said outer wall,
said support structure having a body constructed and arranged to support the object and a volume existing between the object and said support structure,
said body of said support structure including a supply line to supply a gas in said volume between the object and said support structure, and said support structure being constructed and arranged to control the temperature of the object via said gas in said volume to a desired temperature at least before said object is transferred from said load lock towards the lithographic projection apparatus; and
a processor in communication with a pump to depressurize the load lock volume by the pump from a first pressure to a second pressure, the processor also being arranged to control the temperature of the gas such that the object is at a predetermined temperature that is higher than the desired temperature when said processor starts depressurizing said load lock volume.

23. A lithographic projection assembly according to claim 22, wherein
said load lock is constructed and arranged to transfer an object between a first environment and a second environment;
said lithographic projection assembly further comprising:
an object handler comprising a handler chamber in which said second environment prevails; and
said projection system comprising a projection chamber, wherein said handler chamber and said projection chamber are constructed and arranged to exchange the object between themselves.

24. A lithographic projection assembly according to claim 23, wherein said projection assembly comprises:
a support structure constructed and arranged to support said patterning device;
a substrate table for holding a substrate; and
said projection system constructed and arranged to project said patterned beam onto a target portion of said substrate.

25. A method for manufacturing a device comprising:
providing a substrate that is at least partially covered by a layer of radiation-sensitive material;
providing a beam of radiation using a radiation system;
patterning the beam with a pattern in its cross-section; and
projecting the patterned beam of radiation onto a target portion of the layer of radiation-sensitive material,
providing the substrate to a lithographic projection apparatus through a load lock, the load lock having an outer wall at least partly defining a load lock chamber accommodating a support structure supporting the substrate when in the load lock at a predetermined pressure, and
controlling the temperature of the substrate via a gas in a volume between the substrate and the support structure such that the substrate is at a desired temperature at least before said substrate is transferred from said load lock towards the lithographic projection; and
depressurizing a load lock volume by a pump from a first pressure to a second pressure with a processor, the processor arranged to control the temperature of the gas such that the substrate is at a predetermined temperature that is higher than the desired temperature when the processor starts depressurizing the load lock volume.

* * * * *

UNITED STATES PATENT AND TRADEMARK OFFICE
CERTIFICATE OF CORRECTION

| | | |
|---|---|---|
| PATENT NO. | : 7,394,520 B2 | Page 1 of 1 |
| APPLICATION NO. | : 10/797608 | |
| DATED | : July 1, 2008 | |
| INVENTOR(S) | : Klomp et al. | |

It is certified that error appears in the above-identified patent and that said Letters Patent is hereby corrected as shown below:

Column 21
Line 11 replace "to $1.5^7$" with --to $1.5 \; 10^7$--.

Signed and Sealed this

Sixteenth Day of September, 2008

JON W. DUDAS
*Director of the United States Patent and Trademark Office*